United States Patent
Duong et al.

(10) Patent No.: US 8,853,081 B2
(45) Date of Patent: Oct. 7, 2014

(54) HIGH DOSE ION-IMPLANTED PHOTORESIST REMOVAL USING ORGANIC SOLVENT AND TRANSITION METAL MIXTURES

(71) Applicant: Intermolecular Inc., San Jose, CA (US)

(72) Inventors: Anh Duong, Fremont, CA (US); Olov Karlsson, San Jose, CA (US); Sven Metzger, Dresden (DE)

(73) Assignee: Intermolecular, Inc., San Jose, CA (US)

(*) Notice: Subject to any disclaimer, the term of this patent is extended or adjusted under 35 U.S.C. 154(b) by 0 days.

(21) Appl. No.: 13/728,079

(22) Filed: Dec. 27, 2012

(65) Prior Publication Data

US 2014/0187041 A1    Jul. 3, 2014

(51) Int. Cl.
 *H01L 21/306* (2006.01)
(52) U.S. Cl.
 CPC .................. *H01L 21/306* (2013.01)
 USPC .......... 438/689; 438/690; 438/691; 438/692; 216/37; 216/67; 510/176
(58) Field of Classification Search
 USPC ............... 438/689–692; 216/37, 67; 134/1.3; 510/176
 See application file for complete search history.

(56) References Cited

U.S. PATENT DOCUMENTS

| | | | |
|---|---|---|---|
| 6,080,531 A | 6/2000 | Carter | |
| 6,383,724 B1 | 5/2002 | Carter | |
| 7,741,429 B2 | 6/2010 | Russell | |
| 8,440,513 B2* | 5/2013 | Ono et al. | 438/170 |
| 8,497,233 B2* | 7/2013 | Westwood | 510/175 |
| 2008/0171682 A1* | 7/2008 | Kane et al. | 510/176 |
| 2008/0269096 A1* | 10/2008 | Visintin et al. | 510/176 |
| 2009/0163396 A1* | 6/2009 | Hsu | 510/176 |
| 2010/0035786 A1 | 2/2010 | Westwood | |
| 2011/0039747 A1* | 2/2011 | Zhou et al. | 510/176 |

FOREIGN PATENT DOCUMENTS

| | | |
|---|---|---|
| EP | 2111445 B1 | 10/2009 |
| WO | WO-2007-078445 A1 | 7/2007 |

OTHER PUBLICATIONS

Westwood, G., et al.; IonImplanted Photoresist Strippers; Jul. 1, 2009; Semiconductior International 4 pages.
Kim, Y.J., et al.; Stripping and Cleaning of HighDose IonImplanted Photoresists Using a SingleWafter SingleChamber DryWest Hybrid System; Jan. 1, 2009; Trans Tech Publications; Solid State Phenomena vols. 145146 pp. 269272.

* cited by examiner

*Primary Examiner* — Lan Vinh
*Assistant Examiner* — Maki Angadi (57) ABSTRACT

Provided are methods for processing semiconductor substrates to remove high-dose ion implanted (HDI) photoresist structures without damaging other structures made of titanium nitride, tantalum nitride, hafnium oxide, and/or hafnium silicon oxide. The removal is performed using a mixture of an organic solvent, an oxidant, a metal-based catalyst, and one of a base or an acid. Some examples of suitable organic solvents include dimethyl sulfoxide, n-ethyl pyrrolidone, monomethyl ether, and ethyl lactate. Transition metals in their zero-oxidation state, such as metallic iron or metallic chromium, may be used as catalysts in this mixture. In some embodiments, a mixture includes ethyl lactate, of tetra-methyl ammonium hydroxide, and less than 1% by weight of the metal-based catalyst. The etching rate of the HDI photoresist may be at least about 100 Angstroms per minute, while other structures may remain substantially intact.

20 Claims, 4 Drawing Sheets

HIGH DOSE ION-IMPLANTED PHOTORESIST REMOVAL USING ORGANIC SOLVENT AND TRANSITION METAL MIXTURES

BACKGROUND

Semiconductor devices have dramatically decreased in size in the last few decades. Modern devices include features that are 350 nanometers, 90 nanometers, and 65 nanometers in size and often even smaller. As device and feature sizes continue to shrink, processing methods need to be improved.

Many semiconductor substrates are subjected to multiple lithographic operations that involve deposition and removal of photoresist materials onto the substrates. Each time a photoresist is deposited onto a substrate, it has to be stripped away (e.g., etched) after lithographic processing. Conventionally, photoresist stripping involves plasma ashing followed by washing with a strong acid and hydrogen peroxide. However, many materials commonly used in integrated circuits can be easily damaged by these photoresist stripping techniques.

SUMMARY

Provided are methods for processing semiconductor substrates to remove high-dose ion implanted (HDI) photoresist structures without damaging other structures made of titanium nitride, tantalum nitride, hafnium oxide, and/or hafnium silicon oxide. The removal is performed using a mixture of an organic solvent, an oxidant, a metal-based catalyst, and one of a base or an acid. Some examples of suitable organic solvents include dimethyl sulfoxide, n-ethyl pyrrolidone, monomethyl ether, and ethyl lactate. Transition metals in their zero-oxidation state, such as metallic iron or metallic chromium, may be used as catalysts in this mixture. In some embodiments, a mixture includes ethyl lactate, tetramethyl ammonium hydroxide, and less than 1% by weight of the metal-based catalyst. The etching rate of the HDI photoresist may be at least about 100 Angstroms per minute and even at least about 200 Angstroms per minute, while other structures may remain substantially intact.

In some embodiments, a method for processing semiconductor substrates involves providing a semiconductor substrate including a first structure and a second structure, exposing the semiconductor substrate to a mixture of an organic solvent, an oxidant, a metal-based catalyst, and one of a base or an acid, and etching the first structure. The first structure includes high-dose ion implanted (HDI) photoresist, while the second structure includes one of titanium nitride, tantalum nitride, hafnium oxide, or hafnium silicon oxide. The first structure may be completely removed from the semiconductor substrate during etching, while the second structure remains intact. For example, the thickness of the second structure may be reduced by less than 10% or even less than 1% during this process. The mixture is formulated in such a way that the first structure is reactive to this mixture and removed when exposed to the mixture, while the second structure is substantially inert to this mixture. The mixture is specifically designed for various materials of the first and second structures and may be changed if different materials are used.

In some embodiments, the second structure is covered by the first structure prior to exposing the semiconductor substrate to the mixture. The second structure becomes exposed to the mixture when the first structure is removed. As such, the mixture should be selected such that the second structure is substantially inert to the mixture.

In some embodiments, the second structure includes hafnium oxide. For example, the second structure may be a gate dielectric or a dielectric used in a capacitor stack. Alternatively, the second structure may include titanium nitride. For example, the second structure may be an electrode. The same or different mixtures may be used for processing semiconductor substrate including these different second structures.

In some embodiments, the process is repeated using the same substrate to remove other HDI photoresist layers. In other words, the process may involve multiple etching cycles. The other HDI photoresist layers may have the same composition as the initially removed HDI layer. However, other structures, which are exposed to mixtures during different cycles, may be made from different materials. For example, a process may be initial performed in which the first structure includes HDI photoresist, while the second structure includes titanium nitride. The process may be then repeated such that the first structure also includes HDI photoresist, while the second structure now includes hafnium oxide. In this example, titanium nitride and hafnium oxide structures may correspond to different components of the same integrated circuit, e.g., a titanium nitride electrode and a hafnium oxide dielectric. The same or different mixtures may be used for different etching cycles.

In some embodiments, the second structure includes two or more of the following materials: titanium nitride, tantalum nitride, hafnium oxide, and hafnium silicon oxide. The second structure may represent a group of different components provided on the same substrate, e.g., an electrode, gate dielectric.

In some embodiments, the first structure has a thickness of between about 1000 Angstroms and about 5000 Angstroms or, more specifically, between about 2000 Angstroms and about 3000 Angstroms. An etching rate of the first structure may be at least about 100 Angstroms per minute or, more specifically, at least about 200 Angstroms per minute, and even at least about 500 Angstroms per minute. In some embodiments, the etching rate may be up to 1000 Angstroms per minute. As such, the complete removal of the first structure may be performed in less than 30 minutes or, more specifically, in less than 10 minutes.

At the same time, an etching rate of the second structure may be less than about 5 Angstroms per minute or, more specifically, less than about 1 Angstrom per minute, or even less than about 0.1 Angstroms per minute. In some embodiments, an etching selectivity of the first structure to the second structure is least about 50 times or, more specifically, at least about 100 times or even at least about 500 times. For purposes of this disclosure, the etching selectivity is defined as a ratio of etching rates.

Some examples of an organic solvent that can be used in the mixture include dimethyl sulfoxide (DMSO), dipropylene glycol monomethyl ether, ethyl lactate, ethylene glycol, 2-heptanone, n-ethyl pyrrolidone, n-methylethanolamine, and propylene carbonate. In some embodiments, the organic solvent is ethyl lactate. Examples of the oxidant include hydrogen peroxide and ozone. The concentration of the oxidant in the mixture may be less than about 10% by weight or, more specifically, between about 1% and 10% by weight, such as about 2-5% by weight.

In some embodiments, the mixture includes a base. The concentration of the base in the mixture may be less than about 10% by weight or, more specifically, between about 1% and 10% by weight, such as about 2-5% by weight. Some examples of suitable bases include tetra-methyl ammonium hydroxide (TMAH), ammonium hydroxide, and ammonium fluoride.

In some embodiments, the mixture includes an acid. The concentration of the acid in the mixture may be less than about 10% by weight or, more specifically, between about 1% and 10% by weight, such as about 2-5% by weight. Some examples of suitable acids include hydrochloric acid, sulfuric acid, nitric acid, and hydrofluoric acid.

In some embodiments, the metal-based catalyst includes one or more transition metals in their zero-oxidation state. Some examples include metallic iron, metallic chromium, metallic manganese, metallic ruthenium, metallic rhodium, metallic platinum, metallic palladium, metallic gold, and metallic iridium. The concentration of the metal-based catalyst in the mixture may be less than about 1% by weight or, more specifically, less than about 0.25% by weight. The metal based catalysts may be provided as metal powder. In some embodiments, in order to increase solubility of the metal-based catalyst, metals ions may be used and the metal based catalysts may be provided as a base or a salt.

These and other embodiments are described further below with reference to the figures.

DETAILED DESCRIPTION OF EXAMPLE EMBODIMENTS

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.
Introduction Ion implantation of photoresist coated substrate may be used to control doping levels during integrated circuit fabrication. This operation results in formation of HDI photoresist, which is a temporary structure and which needs to be removed prior to forming additional structures on the substrate. The removal process is sometimes referred to as cleaning, stripping, or etching of the HDI photoresist.

The HDI photoresist removal process can be very challenging in order to yield a high degree of substrate cleanliness. For example, many conventional removal processes are prone to photoresist popping, surface residues, metal contamination, or deterioration of other components, such titanium nitride, tantalum nitride, hafnium oxide, or hafnium silicon oxide components. A physical structure of the HDI photoresist can cause some of these problems.

As noted above, HDI photoresists is formed by exposing an initial photoresist layer to ion implantation. The initial layer is typically made of hydrocarbon polymers. The ion implantation depletes the surface of this initial polymer layer of hydrogen and transforms the initial photoresist into two layers collectively forming the HDI photoresist. The degree of this transformation depends on species, dosage, and energy of implanted ions. High-dose implantation is typically characterized by doses higher than $1 \times 10^{15}/cm^2$. The two layers of the HDI photoresist may be referred to as an outer layer, which includes hardened carbonized crust, and an inner layer, which includes more hydrogen. Because the outer layer is depleted of hydrogen, its ashing rates during conventional resist removal processes are much slower than that of the inner layer. Furthermore, the inner layer may contain some nitrogen and even some original casting solvent, which will outgas and expand when subjected to elevated ashing temperatures. This phenomenon causes popping of the outer layer, since the outer layer expands at a much slower rate and the volatile substrates force their way through the outer layer.

Photoresist breakage and separation may be caused by internal gas formation within the photoresist (e.g., due to decomposition). This phenomenon is sometimes referred to as photoresist popping is one of the major sources of defects with conventional plasma ashing systems. The popping effects include particle contamination of substrates and processing chambers. Some of these contaminants are highly oxidized materials and may require very aggressive post-ash wet cleaning using strong acids and peroxides. This ashing and/or post ashing cleaning may be very damaging to other structures provided on the substrate, which are often made from titanium nitride, tantalum nitride, hafnium oxide, hafnium silicon oxide, and other like materials. Furthermore, this ashing and post-ashing cleaning are costly and hazardous and also does not effectively remove some inorganic residues, such as implant species, silicon, silicon dioxide, and resist additives.

Provided are methods for processing semiconductor substrates to remove HDI photoresist structures without damaging other structures made of titanium nitride, tantalum nitride, hafnium oxide, and/or hafnium silicon oxide. Unlike conventional plasma ashing process, the described processes involve liquid-based etching of HDI photoresist. Etching mixtures and conditions are specifically selected to have high photoresist etching rates, while being substantially inert to various other materials.

An HDI photoresist removal process may involve exposing a substrate to a mixture of an organic solvent, an oxidant, a metal-based catalyst, and one of a base or an acid. Some examples of suitable organic solvents include dimethyl sulfoxide, n-ethyl pyrrolidone, monomethyl ether, and ethyl lactate. Transition metals in their zero-oxidation state, such as metallic iron or metallic chromium, may be used as catalysts in this mixture. In some embodiments, less than about 1% by weight of the metal-based catalyst may be used. Furthermore, some metal-based catalysts may include metal ions instead of or in addition to metals in their zero-oxidation state. Metals ions may be easier to dissolve in various organic solvents than, for example, metal particles. Ozone or hydrogen peroxide may be used as the oxidant. Unlike in some conventional post-ashing cleaning, the oxidant is presented at substantially lower concentrations to preserve integrity of other components. In some embodiments, the concentration of the oxidant is between about 1% and 10% by weight.

In some embodiments, a mixture includes ethyl lactate, tetra-methyl ammonium hydroxide (TMAH), and less than 1% by weight of the metal-based catalyst. Another example of a suitable mixture includes dimethyl sulfoxide, hydrogen peroxide, ammonia hydroxide, and a metal-based catalyst. Furthermore, a mixture may include n-ethyl pyrrolidone, hydrochloric acid, and a metal-based catalyst.

In general, a mixture is specifically formulated to have a high etching rate of the HDI photoresist, while keeping other structures substantially intact. In some embodiments, the etching rate of the HDI photoresist may be at least about 100 Angstroms per minute and even at least about 200 Angstroms per minute. The etching selectivity, which is defined by a ratio of etching rates, may be at least about 100 for HDI photoresist relative to titanium nitride, tantalum nitride, hafnium oxide, or hafnium silicon oxide.

Semiconductor Device Examples

Figure 1A:
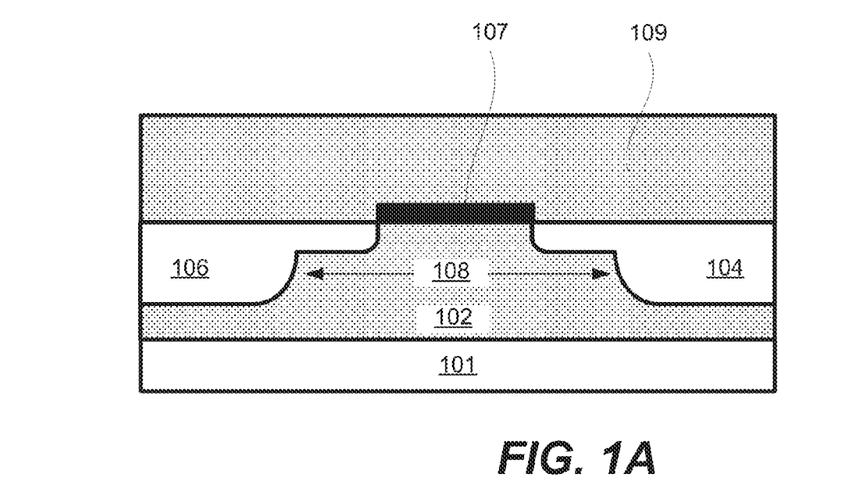
FIGS. 1A and 1B illustrate schematic representations of semiconductor substrate portions before and after removal of HDI photoresist structure, in accordance with some embodiments.
Figure 1B:
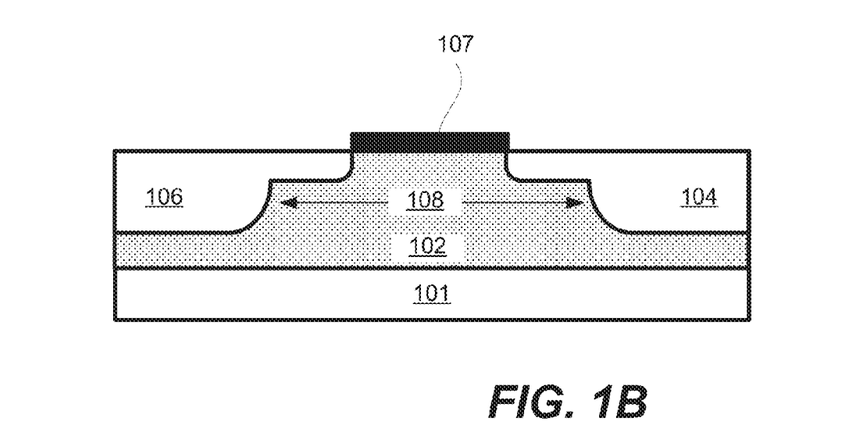

A brief description of semiconductor device examples is presented below to provide better understanding of various HDI photoresist etching and selectivity features. Specifically, FIGS. 1A and 1B illustrate schematic representations of substrate portions including MOS device 100 before removal of HDI photoresist 109 and the same device 110 after complete removal of the photoresist, in accordance with some embodiments.

The references below are made to positive metal-oxide semiconductor (PMOS) devices but other types of MOS devices are within the scope as well. MOS device 100 includes a p-doped substrate 101 and an n-doped well 102 disposed within substrate 101. Substrate 101 is typically a part of an overall wafer that may include other components. Some of these components may include titanium nitride structures, tantalum nitride structures, hafnium oxide structures, and/or hafnium silicon oxide structures that are exposed to a mixture during removal of HDI photoresist. For example, gate dielectric 117 may be formed from hafnium oxide, which is a promising new material for this component as it has a very high a dielectric constant and a large conduction band offset.

P-doped substrate 101 may include any suitable p-type dopants, such as boron and indium, and may be formed by any suitable technique. N-doped well 102 may include any suitable n-type dopants, such as phosphorus and arsenic, and may be formed by any suitable technique. For example, n-doped well 102 may be formed by doping substrate 101 using ion implantation, which corresponds to forming HDI photoresist 109. While HDI photoresist 109 is shown as a continuous layer, it may be pattern to define exposed and non-exposed areas.

MOS device 100 also includes p-doped source region 104 and drain region 106 (or simply the source and drain) disposed in n-doped well 102. Source 104 and drain 106 are located on each side of gate electrode 112 and form channel 108 within n-doped well 102. Source 104 and drain 106 may include a p-type dopant, such as boron. Source 104 and drain 106 may be also formed by ion implantation, which may involve forming HDI photoresist 109. Regardless of operations that cause formation of HDI photoresist 109, HDI photoresist 109 needs to be removed without damaging other components of MOS device 100.

An initial photoresist layer (before ion implantation) is coated over a substrate to facilitate masking of certain portions of the substrate in preparation for further processing. A spin coating process may be used for this purpose. The averaged thickness of the initial resist layer may be less than about 5 microns. Generally, the initial photoresist layer includes an organic material, such as a radiation sensitive organic material. Some examples include diazonaphthoquinone (DNQ), novolac resin, or other suitable positive resist type material. Specific examples include Hoechst AZ 4620 and Hoechst AZ 4562 supplied by Hoechst/AZ Electronic Materials and Shipley 1400-17, Shipley 1400-27, Shipley 1400-37, and Shipley microposit developer supplied by Shipley/Rohm and Haas. The exposure for the initially coated photoresist may proceed with decomposition of diazoquinone that corresponds to evolution of nitrogen gas and production of carbenes in the exposed layer. In some embodiments, the initial photoresist layer may be patterned as an ion implantation mask by a conventional lithography technique.

Returning to FIG. 1A, p-doped source region 104 and drain region 106 may be formed by ion-implantation technique, are preferably doped with impurities, such as boron ($B^{11}$) ions. The implantation dose may in the range of $10^{15}$ to $5\times10^{16}$ cm$^{-2}$, and the implantation energy of may be in the range of 30 to 100 keV, depending on the junction depths. After ion implantation, HDI photoresist 109 may have a thickness of at least about 1000 Angstroms, such as between about 1000 Angstroms and 500 Angstroms or, more specifically, between about 2000 Angstroms and 3000 Angstroms.

FIG. 1B illustrates a schematic representation of MOS device 110 after complete removal of HDI photoresist 109, in accordance with some embodiments. Various features of this removal process are described below with reference to FIG. 2. The removal of HDI photoresist 109 does not damage titanium nitride, tantalum nitride, hafnium oxide, or hafnium silicon oxide components of MOS device 110 such that these comments remain substantially intact. In some embodiments, these components experience reduction in their thickness of less than 5 Angstrom or even less than 1 Angstrom.

Other devices that include HDI photoresist and titanium nitride, tantalum nitride, hafnium oxide, or hafnium silicon oxide structures are also within the scope of this disclosure. For example, a DRAM capacitor stack including a hafnium oxide dielectric and one or more electrodes formed from titanium nitride may be etched using techniques described herein.

Processing Examples

Figure 2:
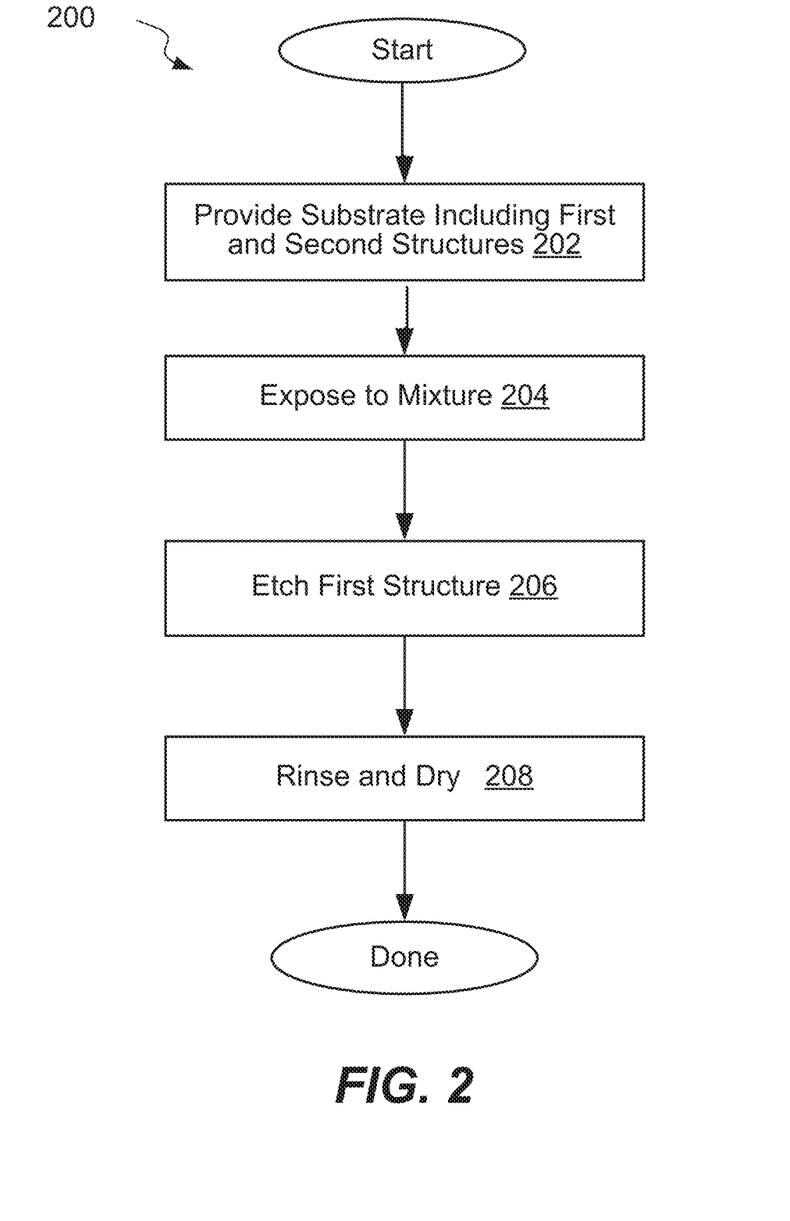
FIG. 2 illustrates a process flowchart corresponding to a method of processing a semiconductor substrate to remove HDI structures from the surface of the substrate, in accordance with some embodiments.

FIG. 2 illustrates a process flowchart corresponding to method 200 of processing a semiconductor substrate to remove HDI photoresist, in accordance with some embodiments. Method 200 may commence with providing a semiconductor substrate including a HDI photoresist structure (e.g., a first structure) and another structure formed from one of titanium nitride, tantalum nitride, hafnium oxide, or hafnium silicon oxide (e.g., a second structure) during operation 202. Some substrate examples are described above with reference to FIGS. 1A and 1B. Specifically, the second structure may include hafnium oxide or hafnium silicon oxide. In another example, the second structure includes titanium nitride. In yet another example, the second structure includes tantalum nitride. The thickness of the first structure may be between about 1000 Angstroms and 5000 Angstroms or, more specifically, between about 2000 Angstroms and 3000 Angstroms.

In some embodiments, the substrate has one or more additional structures (e.g., a third structure, a fourth structure) that include one of titanium nitride, tantalum nitride, hafnium oxide, or hafnium silicon oxide. The materials of these other structures may be different from the material of the second structures.

In some embodiments, the second structure is covered by the first structure prior to exposing the semiconductor substrate to a mixture used for stripping the HDI photoresist in the first structure. Even in this example, the second structure becomes exposed to the mixture after the HDI photoresist is removed.

Method 200 may proceed with exposing the semiconductor substrate to a mixture during operation 204. Specifically, the mixture comes in contact with the HDI photoresist and, at some point, with other structures provided on the same substrate. It should be noted that no previous processing (e.g., ashing, etching, and the like) that would change composition of the HDI photoresists is performed on the HDI photoresist after forming the HDI photoresist prior to operation 204. The HDI photoresist exposed to the mixture during operation 204 has substantially the same composition as when it was formed by ion implantation. As such, operation 204 is different from conventional post ashing cleaning operations since different kinds of materials are removed from the substrate. Operation 204 also uses different kinds of mixtures to remove the HDI photoresist than conventional post ashing cleaning operations as further described below.

A mixture used during operation 204 may be in the form of a solution, suspension, or other types of mixtures. The mixture may be agitated to prevent separation of different components of the mixture. In some embodiments, all components of the mixture are distributed uniformly throughout the entire volume of the mixture. As such, all components may have uniform concentrations throughout the entire volume. One or more surfactants may be used to prevent separation and enhancing etching using the mixture. Some examples of surfactants are presented below. The use of surfactants and/or agitation may be useful for suspensions, in which some of the materials (e.g., metal-based catalysts are not completely dissolved).

The mixture includes an organic solvent, an oxidant, a metal-based catalyst, and one of a base or an acid. Some examples of suitable organic solvents include dimethyl sulfoxide (DMSO), dipropylene glycol monomethyl ether, ethyl lactate, ethylene glycol, 2-heptanone, n-ethyl pyrrolidone, n-methylethanolamine, or propylene carbonate. In some embodiments, the organic solvent is ethyl lactate. Other organic solvent that demonstrated good etching performance include n-ethyl pyrrolidone and DMSO. The amount of the organic solvent may be between about 80% and 98% by weight or, more specifically, between about 85% and 90% by weight.

Examples of suitable oxidants include ozone, hydrogen peroxide, peroxyacids, organic peroxides (e.g., benzoyl peroxide) hypochlorates, dichromates, permanganates, and nitric acid. In some embodiments, the oxidant is hydrogen peroxide. The amount of the oxidant present in the mixture may be less than 10% by weight or, more specifically, between about 1% and 10% by weight. Such low concentrations of the oxidant are typically not used in conventional photoresist removing processes.

The metal-based catalyst may be present in a form of metals in their zero-oxidation state or in a form of metal ions. The metals in their zero-oxidation state may be provided as a metal powder. In some embodiments, finely divided metal catalysts may be provided as salts or bases. The metal-based catalysts may include various transition metals and other metals having suitable catalytic activity. Some examples include iron, chromium, manganese, ruthenium, rhodium, and platinum or, more specifically, metallic iron, metallic chromium, metallic manganese, metallic ruthenium, metallic rhodium, and metallic platinum. The amount of the metal-based catalyst in the mixture may be less than about 1% by weight or, more specifically, less than about 0.25% by weight.

The mixture may include either a base or an acid. In some embodiments, the mixture may include, but are not limited to, hydrochloric, nitric, sulfuric, hydrofluoric, phosphoric, sulfuric, acetic or citric acids. Without being restricted to any particular theories, acid may help with breaking the C—C bond in the photoresist. The pH of the mixture may be less than 5). Acid selection influences both implanted polymer cleaning and overall material compatibility. Thus, the choice of acid can allow for shortened cleaning times or lower operating temperatures. In some embodiments, the mixture includes a base. The concentration of the base in the mixture may be less than about 10% by weight or, more specifically, between about 1% and 10% by weight, such as about 2-5% by weight. Some examples of suitable bases include tetra-methyl ammonium hydroxide (TMAH), ammonium hydroxide, and ammonium fluoride. In TMAH is used, it attacks the silicon network of the photoresist crust with the help of the metal catalyst.

In some embodiments, the mixture includes an acid. The concentration of the acid in the mixture may be less than about 10% by weight or, more specifically, between about 1% and 10% by weight, such as about 2-5% by weight. Some examples of suitable acids include hydrochloric acid, sulfuric acid, nitric acid, and hydrofluoric acid. The mixture may be water-based. The presence of water helps with dissolving the metal catalyst.

In some embodiments, the mixture is being substantially free of fluoride ions, i.e., the concentration of fluoride ions is less than 1% by weight or even less than 0.1% by weight in the mixture. The fluoride is not used to provide the activation energy to break the C=C of the photoresist crust. Instead, this activation energy is provided by the metal catalyst. In some embodiments, the mixture may include a surfactant for reducing the decomposition of the mixture and/or for improving the wetting of the substrate surface. Some examples of surfactants include betaines and sulfobetaines (e.g., alkyl betaines, amidoalkyl betaines, alkyl sulfobetaines and amidoalkyl sulfobetaines), aminocarboxylic acid derivatives (e.g., amphoglycinates, amphopropionates, amphodiglycinates, and amphodipropionates), iminodiacids (e.g., alkoxyalkyl iminodiacids or alkoxyalkyl iminodiacids), amine oxides (e.g., alkyl amine oxides and alkylamido alkylamine oxides), fluoroalkyl sulfonates and fluorinated alkyl amphoterics, and mixtures thereof. The concentration of the surfactant may be less than about 5% by weight or, more specifically, less than about 3% by weight.

The mixture may be maintained at a temperature of between 25° C. and 80° C. or, more specifically, between 40° C. and 60° C. at least during etching of the first structure. For example, the etching solution may be maintained at a temperature of 50° C. at least during etching of the first structure. While higher temperatures may result in faster etching, etching selectivity may be compromised.

Method 200 may proceed with etching the first HDI photoresist structure during operation 206. The etching rate of this structure may be at least about 100 Angstroms per minute or, more specifically, at least about 200 Angstroms per minute. The HDI photoresist structure may be completely removed from the substrate during operation 206. At the same time, the second structure may remain substantially intact. In some embodiments, the etching rate of the second structure is less than 1 Angstrom per minute or even less than about 0.25 Angstroms per minute. The etching selectivity of the first structure to the second structure may be at least about 50 times, at least about 100 times, and even at least about 200 times.

After completion of operation 206, method 200 may proceed with rinsing and drying the substrate during operation 208. The residual etching solution is removed from the substrate surface during this operation by, for example, rinsing the surface with deionized water and drying with an inert gas, such as nitrogen or argon.

Experimental Results

Figure 3A:
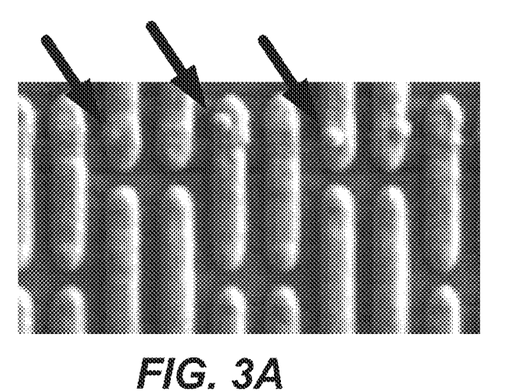
FIG. 3A-3C illustrates scanning electron microscope (SEM) images of three different substrates processed using different photoresist stripping methods, in accordance with some embodiments.
Figure 3B:
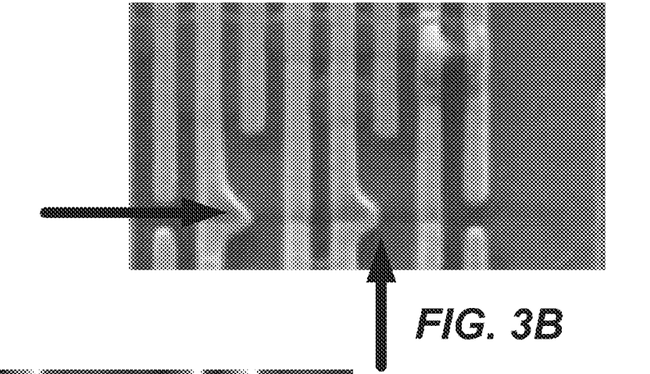
Figure 3C:
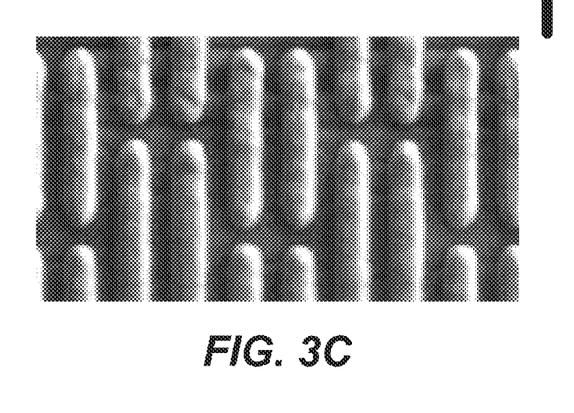

FIG. 3A-3C illustrates scanning electron microscope (SEM) images of three different substrates processed using different photoresist stripping methods, in accordance with some embodiments. The substrates depicted in FIGS. 3A-3B were processed using conventional ashing and post-ashing cleaning techniques and contain various resist residues, some of which are identified with arrows. The substrate depicted in FIG. 3C was cleaned using a mixture of an organic solvent, an oxidant, a metal-based catalyst, and one of a base or an acid as described in this document. Specifically, FIG. 3A shows the SEM images of the samples processed using conventional oxygen plasma dry ashing followed by etching with a mixture of ammonium hydroxide and hydrogen peroxide. FIG. 3B shows the SEM image of the sample that does not have a complete removal of the photoresist and has some damage of the gate stacks that resulted from a high temperature (i.e., >130° C.) etching using a mixture of sulfuric acid and hydrogen peroxide. Comparing the SEM images in FIGS. 3A and 3B to the one in FIG. 3C, it can be clearly seen that the substrate depicted in FIG. 3C includes much fewer residues and is more desirable from processing standpoint.

Apparatus Examples

Figure 4:
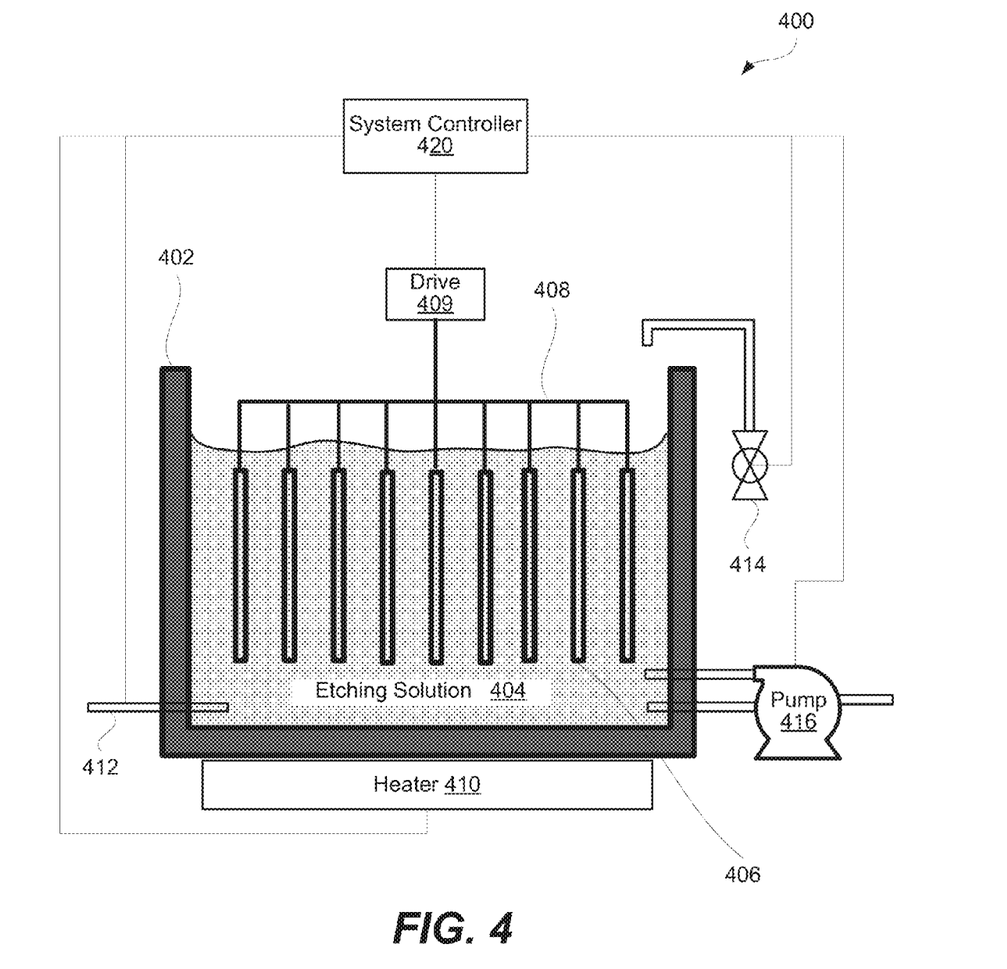
FIG. 4 illustrates a schematic representation of an etching apparatus for processing a semiconductor substrate to HDI photoresist structures from the surface of the substrate, in accordance with some embodiments.

FIG. 4 illustrates a schematic representation of etching apparatus 400 for processing a semiconductor substrate to selectively remove HDI photoresist from the surface of the substrate, in accordance with some embodiments. For clarity, some components of apparatus 400 are not included in this figure. Apparatus 400 includes bath 402 for containing etching solution 404. One or more semiconductor substrates 406 may be submerged into etching solution 404 for processing or, more specifically, for removal of silicon nitride structures. Substrate 406 may be supported by substrate holder 408, which may be attached to drive 409 for moving substrate holder 408. Specifically, substrate holder 408 may be moved to submerge substrates 406 into etching solution 404 for processing, remove substrates 406 from etching solution 404 after processing, and/or to move substrates 406 within etching solution 404 during processing (e.g., to agitate etching solution 404).

Apparatus 400 also includes heater 410 and temperature sensor 412 (e.g., a thermocouple) for maintaining etching solution 404 at a predetermined temperature. Heater 410 and temperature sensor 412 may be connected to system controller 420, which may control power supplied to heater 410 based on signals received from temperature sensor 412. Various features of system controller 420 are described below.

Apparatus 400 may also include a liquid delivery system 414 for supplying additional liquids and controlling the composition of etching solution 404. For example, some components of etching solution 404 may evaporate from bath 402, and these components may be replenished in bath 402 by liquid delivery system 414. Liquid delivery system 414 may be connected to and controlled by system controller 420. Various sensors (e.g., conductivity sensor, weight sensor) may be used to provide signals about potential changes in composition of etching solution 404. Apparatus 400 may be also equipped with pump 416 for recirculating etching solution 404 in bath 402 and other purposes. Pump 416 may be also connected to and controlled by system controller 420.

Apparatus 400 may include system controller 420 for controlling process conditions during silicon nitride etching processes. Controller 420 may include one or more memory devices and one or more processors with a central processing unit (CPU) or computer, analog and/or digital input/output connections, stepper motor controller boards, and the like. In some embodiments, controller 420 executes system control software including sets of instructions for controlling timing of operations, temperature of etching solution 404, composition of etching solution 404, and other parameters. Other computer programs and instruction stored on memory devices associated with controller may be employed in some embodiments.

Conclusion

Although the foregoing concepts have been described in some detail for purposes of clarity of understanding, it will be apparent that some changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A method for processing semiconductor substrates, the method comprising:
   providing a semiconductor substrate comprising a first structure and a second structure,
      the first structure comprising high-dose ion implanted (HDI) photoresist,
      the second structure comprising one of titanium nitride, tantalum nitride, hafnium oxide, or hafnium silicon oxide;
   exposing the semiconductor substrate to a mixture comprising an organic solvent, an oxidant, a metal-based catalyst, and a base; and
   etching the first structure with the mixture,
      wherein the first structure is removed from the semiconductor substrate while the second structure looses less than 1% if its thickness.

2. The method of claim 1, wherein the second structure is covered by the first structure prior to exposing the semiconductor substrate to the mixture.

3. The method of claim 1, wherein the second structure comprises hafnium oxide.

4. The method of claim 1, wherein the second structure comprises titanium nitride.

5. The method of claim 1, wherein the first structure has a thickness of between 1000 Angstroms and 5000 Angstroms.

6. The method of claim 1, wherein an etching rate of the first structure is between 100 Angstroms per minute and 10,000 Angstroms per minute.

7. The method of claim 1, wherein an etching rate of the second structure is less than 1 Angstrom per minute.

8. The method of claim 1, wherein an etching selectivity of the first structure to the second structure is least 100 times.

9. The method of claim 1, wherein the organic solvent comprises one of dimethyl sulfoxide (DMSO), dipropylene glycol monomethyl ether, ethyl lactate, ethylene glycol, 2-heptanone, n-ethyl pyrrolidone, n-methylethanolamine, or propylene carbonate.

10. The method of claim 1, wherein the organic solvent comprises ethyl lactate.

11. The method of claim 1, wherein the oxidant comprises one of hydrogen peroxide or ozone.

12. The method of claim 1, wherein the mixture comprises the base.

13. The method of claim 12, wherein a concentration of the base in the mixture is between 1% by weight and 10% by weight.

14. The method of claim 12, wherein the base comprises one of tetra-methyl ammonium hydroxide (TMAH), ammonium hydroxide, or ammonium fluoride.

15. The method of claim 12, wherein the base comprises tetra-methyl ammonium hydroxide (TMAH).

16. The method of claim 12, wherein the base comprises ammonium hydroxide.

17. The method of claim 12, wherein the base comprises ammonium fluoride.

18. The method of claim 1, wherein the metal-based catalyst comprises one of iron, chromium, manganese, ruthenium, rhodium, or platinum.

19. The method of claim 1, wherein a concentration of the metal-based catalyst in the mixture is less than 1% by weight.

20. A method for processing semiconductor substrates, the method comprising:
   providing a semiconductor substrate comprising a first structure and a second structure,
      the first structure comprising high-dose ion implanted (HDI) photoresist and covering the second structure,
      the second structure comprising hafnium oxide;
   exposing the semiconductor substrate to a mixture comprising ethyl lactate, tetramethyl ammonium hydroxide (TMAH), and less than 1% by weight of one of iron, chromium, manganese, ruthenium, rhodium, or platinum; and
   etching the first structure with the mixture,
      wherein an etching selectivity of the first structure to the second structure is least 100 times.

* * * * *